United States Patent
Sakaray et al.

(10) Patent No.: US 10,548,238 B1
(45) Date of Patent: Jan. 28, 2020

(54) DUCT DESIGN FOR AIRFLOW COOLING SYSTEMS

(71) Applicant: Caterpillar Inc., Deerfield, IL (US)

(72) Inventors: Umakanth Sakaray, Dunlap, IL (US); Marvin K. Baer, Edelstein, IL (US); Ronald Landis, Green Valley, AZ (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 16/218,746

(22) Filed: Dec. 13, 2018

(51) Int. Cl.
*H05K 7/20* (2006.01)
*H02B 1/56* (2006.01)

(52) U.S. Cl.
CPC ..... *H05K 7/20145* (2013.01); *H05K 7/20409* (2013.01); *H02B 1/565* (2013.01); *H05K 7/20163* (2013.01); *H05K 7/20918* (2013.01)

(58) Field of Classification Search
CPC .......... H05K 7/20136–20145; H05K 7/20163; H02G 5/10; H02B 1/56–565
USPC ...... 361/695–697, 679.48–679.51, 676–678; 454/184; 312/236
See application file for complete search history.

(56) References Cited

U.S. PATENT DOCUMENTS

| | | | |
|---|---|---|---|
| 6,462,948 B1 * | 10/2002 | Leija ................. | H05K 7/20727 165/104.33 |
| 6,504,718 B2 * | 1/2003 | Wu .................... | H05K 7/20727 165/104.33 |
| 6,935,419 B2 | 8/2005 | Malone et al. | |
| 7,729,115 B2 * | 6/2010 | Hall .................. | H05K 7/20918 165/183 |
| 2013/0100610 A1 | 4/2013 | Schneider et al. | |
| 2013/0314850 A1 * | 11/2013 | Takahashi ............... | H02B 1/56 361/678 |
| 2014/0342652 A1 | 11/2014 | Dong et al. | |
| 2016/0021782 A1 | 1/2016 | Kurosaki et al. | |

FOREIGN PATENT DOCUMENTS

CN 105699946 B 10/2017
JP 2018037659 A 3/2018

* cited by examiner

Primary Examiner — Zachary Pape
(74) Attorney, Agent, or Firm — Bookoff McAndrews

(57) ABSTRACT

A cooling system may include a housing including an inlet; an outlet; a duct assembly between the inlet and the outlet; and at least one fan located to direct airflow from the inlet, through the duct assembly, and out the outlet; the duct assembly including: a first duct having an entrance facing the at least one fan and an exit normal to the entrance; a second duct having an entrance facing the at least one fan and an exit normal to the entrance; a central passage for receiving airflow from the first duct exit and the second duct exit; a third duct having an entrance fluidly coupled to the central passage; a fourth duct having an entrance fluidly coupled to the central passage; and a plurality of heat sinks located in the third and fourth ducts.

15 Claims, 4 Drawing Sheets

DUCT DESIGN FOR AIRFLOW COOLING SYSTEMS

TECHNICAL FIELD

The present disclosure relates generally to a cooling system for an enclosure, and more particularly, to a duct design for airflow cooling systems within an enclosure.

BACKGROUND

Power supply systems may include power electronics located in an enclosure or housing. Such power electronics typically generate heat, creating the need for a cooling system to dissipate heat from within the enclosure. U.S. Pat. No. 6,935,419 issued to Malone et. al on Aug. 20, 2005 ("the '419 patent") discloses a cooling system for computer electronics. The system described in the '419 patent is configured to cool the electronics via controlling airflow over a plurality of cooling fins. While the heat dissipating apparatus of the '419 patent may be useful, the efficiency of the apparatus and its cooling performance may be improved.

The cooling system of the present disclosure may solve one or more of the problems set forth above and/or other problems in the art. The scope of this disclosure, however, is defined by the attached claims and not by the ability to solve any specific problem.

SUMMARY

In one aspect, a cooling system may comprise: a housing including an inlet; an outlet; a duct assembly between the inlet and the outlet; and at least one fan located to direct airflow from the inlet, through the duct assembly, and out the outlet; the duct assembly including: a first duct having an entrance facing the at least one fan and an exit normal to the entrance; a second duct having an entrance facing the at least one fan and an exit normal to the entrance; a central passage for receiving airflow from the first duct exit and the second duct exit; a third duct having an entrance fluidly coupled to the central passage; a fourth duct having an entrance fluidly coupled to the central passage; and a plurality of heat sinks located in the third and fourth ducts.

In another aspect, a cooling system may comprise: a housing including: an inlet; an outlet downstream of the inlet; a first passage tapered from the inlet toward the outlet; a second passage in fluid communication with the first passage and the outlet; and a heat sink downstream of the second passage.

In yet another aspect, a cooling system may comprise: a housing, comprising: an inlet; an outlet; a duct assembly; and a plurality of fans located to direct airflow from the inlet, through the duct assembly, and out the outlet; the duct assembly including: a tapered first duct having an entrance facing the at least one fan and an exit normal to the entrance; a tapered second duct having an entrance facing the at least one fan and an exit normal to the entrance; a central passage for receiving airflow directly from at least one of the plurality of fans, and from the first duct exit and the second duct exit; a third duct having an entrance fluidly coupled a first sidewall of the central passage; a fourth duct having an entrance fluidly coupled a second sidewall of the central passage; and a plurality of heat sinks located in the third and fourth ducts at the entrance of the third duct and the entrance of the fourth duct.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION

Both the foregoing general description and the following detailed description are exemplary and explanatory only and are not restrictive of the features, as claimed. As used herein, the terms "comprises," "comprising," "having," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, relative terms, such as, for example, "about," "substantially," "generally," and "approximately" are used to indicate a possible variation of ±10% in a stated value or characteristic.

Figure 1:
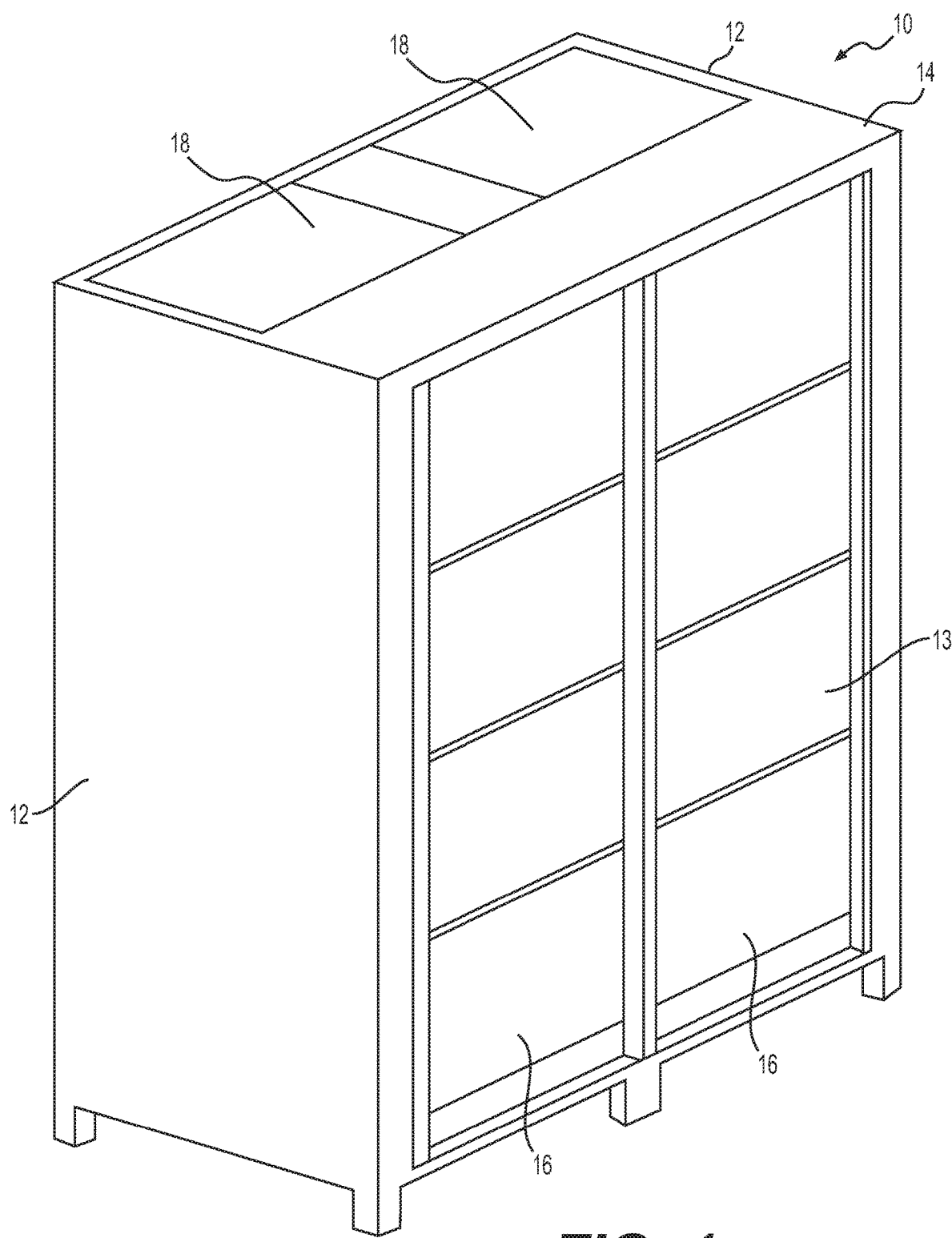
FIG. 1 is a perspective view of an enclosure containing components to be cooled.

FIG. 1 illustrates an exemplary enclosure 10 for storing components that require cooling. In one example, enclosure 10 may be a housing for use in power systems, such as back-up power systems for data centers or hospitals. Enclosure 10 may include power electronics and other components for controlling and/or monitoring the power system. Such power electronics and/or other components may generate heat and require cooling to maintain appropriate system operations. It is understood, however, that enclosure 10 can be any type of enclosure or housing that includes components that require cooling.

Enclosure 10 may be generally rectangular in shape, and may include sides 12, a front 13, and a top 14. Enclosure 10 also may include one or more air inlets 16 and one or more air outlets 18. In one aspect, inlets 16 may be provided on a lower portion of the front 13 of enclosure 10, and outlets 18 may be located at the top 14 of enclosure 10. It is understood that enclosure 10 may include other shapes than rectangular, and that air inlets 16 and air outlets 18 may be located at other locations on enclosure 10.

Figure 2:
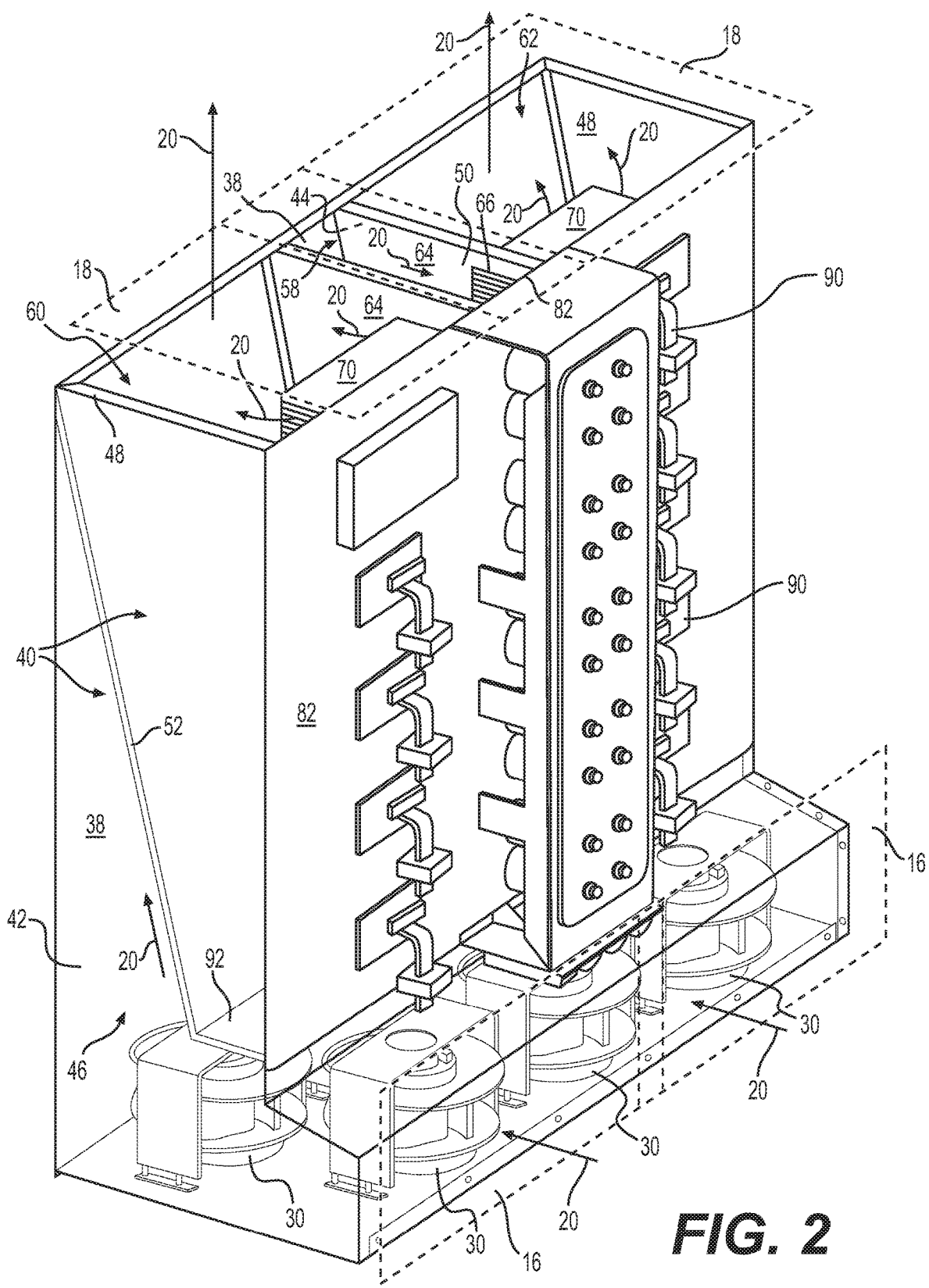
FIG. 2 is a partial cross-sectional perspective view of a cooling system within the enclosure of FIG. 1.

FIG. 2 illustrates portions of the interior of enclosure 10, with certain portions removed or rendered clear for clarity. Enclosure 10 includes a cooling system that provides cooling airflow 20 to dissipate heat from heat generating components 90. Cooling airflow 20 may flow from inlets 16, through a duct assembly 40, to outlets 18. The internal components of enclosure 10 may include, from upstream to downstream, inlets 16, a plurality of fans 30, a first and second duct 42, 44, a central passage 50, a third and fourth ducts 60, 62, a plurality of heat sinks 70 located in third and fourth ducts 60, 62, and outlets 18.

Fans 30 may be located at inlets 16 to draw in cooling airflow 20 from the environment (outside the enclosure 10), and urge the airflow 20 through duct assembly 40 to outlets 18. Fans 30 may be any type of fan, for example a centrifugal fan or propeller fan, or any other type of conventional fan suitable for facilitating airflow 20 through enclosure 10. It will be further understood that while six fans 30 are shown in the enclosure 10, any number of fans 30 could be used as long as they produce sufficient flow through enclosure 10.

Fans 20 may be arranged with axes normal to inlets 16, and configured to direct airflow 20 normal to inlet 16 into first and second ducts 42, 44 as shown in FIG. 2, but other configurations are possible.

Duct assembly 40 may include first and second ducts 42, 44, central passage 50, and third and fourth ducts 60, 62. First and second ducts 42, 44 are mirror images of one another and each is located on one side of central passage 50 such that an exit 58 (FIG. 4) of the first duct 42 faces an exit 58 of the second duct 44. Similarly, third and fourth ducts 60, 62 are mirror images of one another and each is located on one side of central passage 50 such that the entrance 66 (FIG. 4) of the third duct 60 faces the entrance of the fourth duct 62. Accordingly, discussion of first duct 42 or second duct 44 below will apply equally to the other of first duct 42 or second duct 44, and the same reference numbers will be used for common features of each duct. Discussion of third duct 60 or fourth duct 62 will apply equally to the other of third duct 60 or fourth duct 62, and the same reference numbers will be used for common features of each duct.

Figure 3:
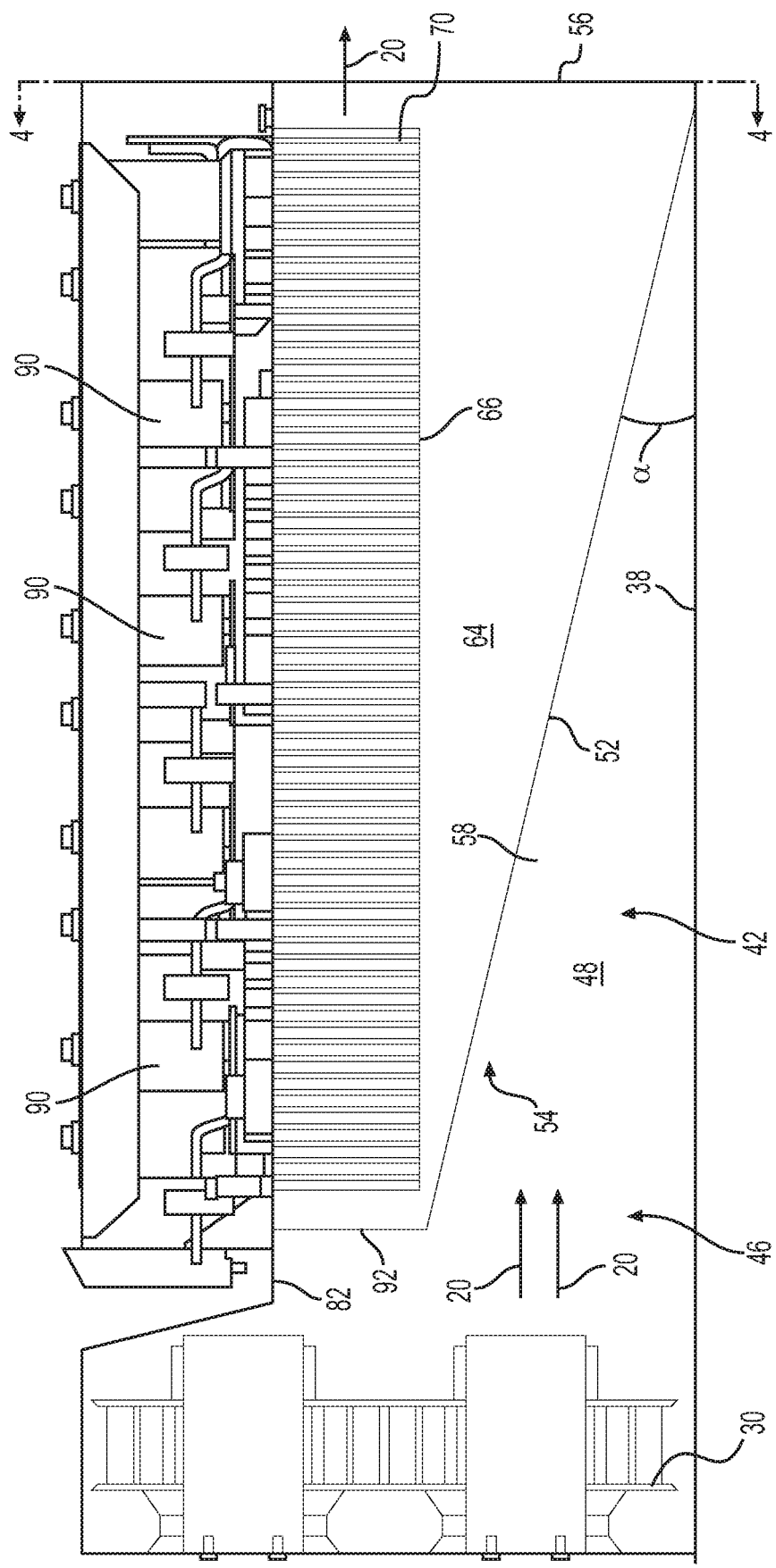
FIG. 3 is a cross-sectional side view of the cooling system of FIG. 2, corresponding to section 3-3 of FIG. 4.

Reference will now be made to FIGS. 2 and 3 to discuss the details of duct assembly 40. Features of duct assembly 40 will be referenced as having front, back, side, and top features. These reference positions correspond to the enclosure of FIG. 1 where inlets 16 are located in the front 13 of enclosure 10, and outlets 18 are located at a top 14 of enclosure 10. It is understood that these positional references are not intended to be limiting, but rather are provided to assist in describing the relative locations of features of duct assembly 40. First duct 42 includes an upstream opening 46 facing one or more fans 30 and orientated normal to the inlets 16. As best shown in FIG. 3, first duct 42 may include a sidewall 48, a back wall 38, and a front wall 52 opposite back wall 38. Front wall 52 may include a tapering portion 54. Tapering portion 54 of front wall 52 may taper from upstream opening 46 to endwall 56, and tapering portion 54 may terminate at the intersection of endwall 56 and back wall 38. Tapering portion 54 may have an approximately constant taper and include an angle α with respect to back wall 38. Angle α may be, for example, in the range of approximately 20 degrees to approximates 60 degrees, or approximately 45 degrees. It is understood that tapering portion 54 may have a different configuration, for example, tapering portion 54 may extend less than the full distance from opening 46 to endwall 56, may end at a location on endwall 56 distanced from back wall 38, and/or may have a variable or compound taper in the direction shown and/or normal to the direction shown. As shown by the cross-section of FIG. 3, first duct 42 may be open opposite sidewall 48 so as to form an exit 58 of first duct 42 so that airflow 20 exits first duct 42 in a direction normal to entrance 46 and into central passage 50. The exit 58 may extend the entire length of first duct 42 as shown, or may be less than the entire length. As discussed above, second duct 44 is a mirror image of first duct 42, and thus also opens into central passage 50.

Figure 4:
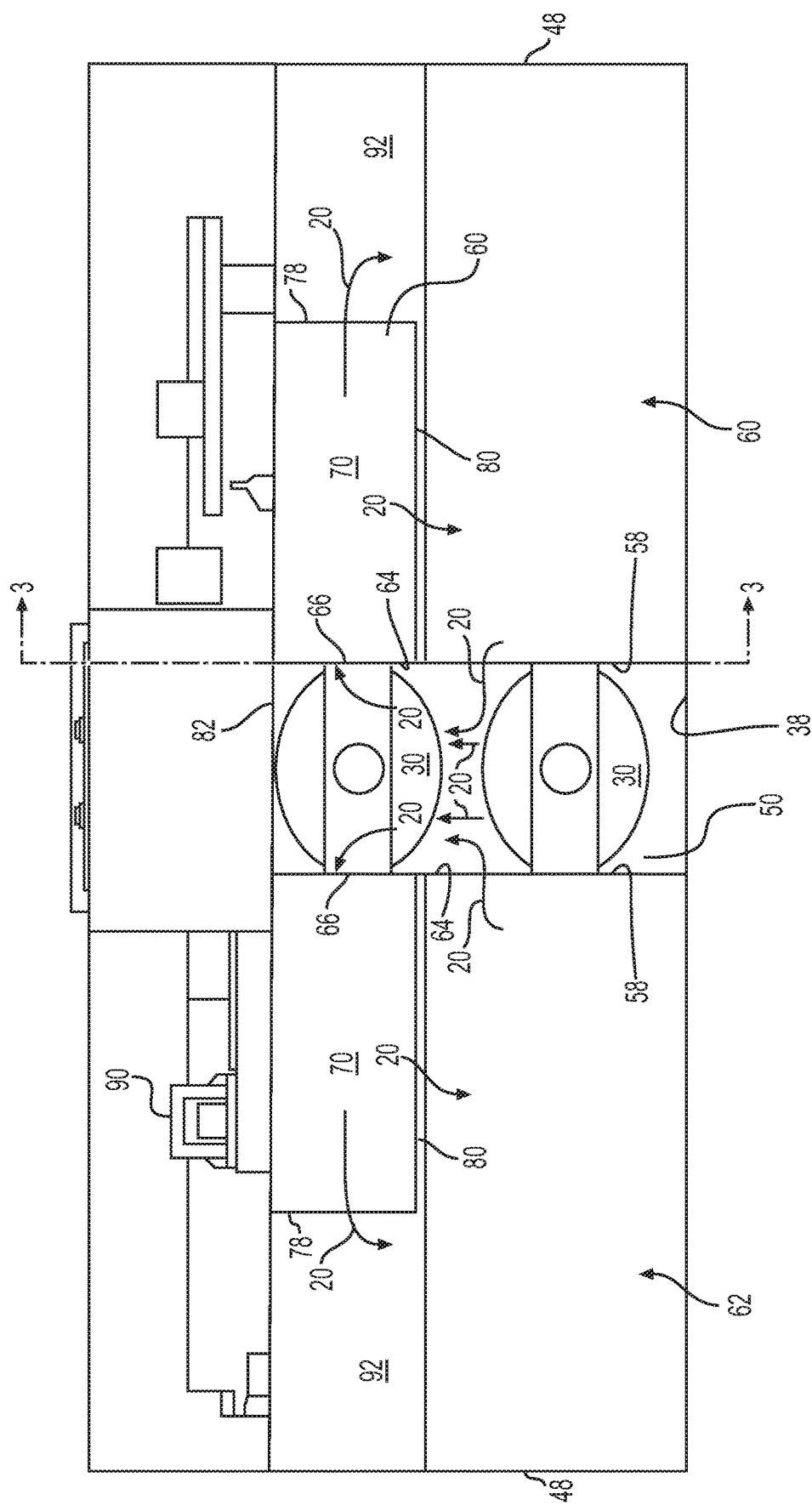
FIG. 4 is a cross-sectional top-down view of the cooling system of FIG. 2, corresponding to section 4-4 of FIG. 3.

Referring to FIG. 4 and the end view of duct assembly 40, central passage 50 may include an open entrance facing at least one fan 30, a front component wall 82, a pair of parallel sidewalls 64, a back wall 38 opposite the front component wall 82, and endwall 56 (FIG. 3) closing a downstream end of central passage 50. Central passage 50 may form a generally rectangular passageway as shown, but it is understood that other shapes are contemplated. Sidewalls 64 may extend from front component wall 82 toward rear wall 38, and terminate at exits 58 of first and second ducts 42, 44. Accordingly, sidewalls 64 taper (corresponding to tapering portion 54) as they progress upstream from endwall 56 toward fans 30. As best shown in FIG. 3, sidewalls 64 may include a rectangular opening forming an exit 66 for central passage 50—and an entrance for third and fourth ducts 60, 62.

Heat sinks 70 may be located within third and fourth ducts 60, 62 so that cooling airflow 20 exiting central passage 50 flows across heat sinks 70. Heat sinks 70 may extend rearwardly from front component wall 82. Heat generating components 90 may also be coupled to front component wall 82, but extending forwardly from an opposite side of the front component wall 82. Thus, heat sinks 70 are coupled to heat generating components 90 to draw heat from the heat generating components 90. The heat sinks 70 may take any conventional form, for example as shown, heat sinks 70 may include a plurality of parallel fins extending normal to sidewalls 64 of the central passage 50, with the fins being formed of heat conducting material. Heat sinks 70 may be sized and configured to extend across the entire exit 66 of sidewall 64 so that all of the cooling airflow 20 flows across heat sinks 70. As best shown in FIG. 4, cooling airflow 20 may exit heat sinks 70 at a side end 78, or at a rear end 80, and into third and fourth ducts 60, 62.

Third and fourth ducts 60, 62 may be in flow communication with outlets 18 and be formed by front component wall 82, front wall 52, sidewall 48, sidewall 64, bottom wall 92, and endwall 56 surrounding outlet 18. As shown in FIGS. 2 and 3, third duct 60 tapers from a downstream end to an upstream end based on the taper of front wall 52. Thus, third duct 60 has a larger downstream end than an upstream end. Thus, third and fourth ducts 60, 62 extend parallel to outlets 18, and receive cooling airflow 20 from exits 66 in a direction normal to the direction of third and fourth ducts 60, 62 and outlet 18.

INDUSTRIAL APPLICABILITY

The cooling system disclosed herein may be applied to any enclosure 10 where cooling of heat generating components 90 is desired. For example, such a cooling system may be used to cool electronic components of a power system.

During operation, cooling airflow 20 may flow from inlets 16, through at least one fan 30, and into first and second ducts 42, 44. Airflow 20 may then flow from entrance 46 of first and second ducts 42, 44, to an exit 58 normal to the entrances 46. Upon exiting first and second ducts 42, 44, airflow 20 enters central passage 50. Airflow 20 also enters central passage directly from one or more fans 30. The cooling airflow 20 may exit central passage 50 through exits 66 of central passage 50 and into third and fourth ducts 60, 62. As the cooling airflow enters the third and fourth ducts 60, 62, cooling airflow flows across a plurality of heat sinks 70 to assist in cooling heat generating components 90, such as electrical components, located on an opposite side of front component wall 82 than heat sinks 70. Cooling airflow 20 then exits heat sinks 70 and exits third and fourth ducts 60, 62 to outlets 18. The taper 54 of front wall 52 helps to provide turbulence and pressure to assist in providing more cooling airflow 20 into contact with the front component wall 82 and heat sinks 70, thereby facilitating heat transfer from the heat generating components 90.

It will be understood that while this disclosure refers to the term "ducts," the ducts described may be any type of "passage" or "passageway," or any other term known to one of ordinary skill in the art to describe airflow paths within a cooling system. Further, it will be apparent to those skilled in the art that various modifications and variations can be made to the disclosed device without departing from the scope of the disclosure. Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A cooling system comprising:
   a housing including
      an inlet;
      an outlet;
      a duct assembly between the inlet and the outlet; and
      at least one fan located to direct airflow from the inlet, through the duct assembly, and out the outlet;
   the duct assembly including:
      a first duct having an entrance facing the at least one fan and an exit normal to the entrance;
      a second duct having an entrance facing the at least one fan and an exit normal to the entrance;
      a central passage for receiving airflow from the first duct exit and the second duct exit;
      a third duct having an entrance fluidly coupled to the central passage;
      a fourth duct having an entrance fluidly coupled to the central passage; and
      a plurality of heat sinks located in the third and fourth ducts.

2. The cooling system according to claim 1, further comprising at least one electronic component connected to the plurality of heat sinks.

3. The cooling system according to claim 2, wherein the at least one electronic component is separated from the third duct and the fourth duct by a wall.

4. The cooling system according to claim 1, wherein the entrance to the fourth duct faces the entrance to the third duct.

5. The cooling system according to claim 1, wherein the first duct includes a wall tapered from an upstream end to a downstream end.

6. The cooling system according to claim 1, wherein the central passage includes an entrance facing the at least one fan.

7. The cooling system according to claim 1, wherein the housing is an enclosure for a power system.

8. The cooling system according to claim 1, wherein the central passage is closed at an end opposite the inlet.

9. The cooling system according to claim 1, wherein the central passage includes a pair of parallel side walls tapered from an upstream end to a downstream end.

10. The cooling system according to claim 9, wherein at least one of the first duct or the second duct includes a wall tapered from the entrance to the outlet.

11. The cooling system according to claim 10, wherein the taper of the pair of side walls follows the taper of the wall of the first duct.

12. The cooling system according to claim 1, wherein the outlet is provided at a downstream end of the third duct and the fourth duct.

13. A cooling system comprising:
    a housing, comprising:
       an inlet;
       an outlet;
       a duct assembly; and
       a plurality of fans located to direct airflow from the inlet, through the duct assembly, and out the outlet;
    the duct assembly including:
       a tapered first duct having an entrance facing the at least one fan and an exit normal to the entrance;
       a tapered second duct having an entrance facing the at least one fan and an exit normal to the entrance;
       a central passage for receiving airflow directly from at least one of the plurality of fans, and from the first duct exit and the second duct exit;
       a third duct having an entrance fluidly coupled to a first sidewall of the central passage;
       a fourth duct having an entrance fluidly coupled to a second sidewall of the central passage; and
       a plurality of heat sinks located in the third and fourth ducts at the entrance of the third duct and the entrance of the fourth duct.

14. The cooling system according to claim 13, wherein the housing is an enclosure for a power system.

15. The cooling system according to claim 13, wherein the inlet and outlet are normal to one another.

* * * * *